(12) United States Patent
Orimo

(10) Patent No.: US 10,811,190 B2
(45) Date of Patent: Oct. 20, 2020

(54) MULTILAYER CERAMIC CAPACITOR, PRINTED CIRCUIT BOARD AND PACKAGE

(71) Applicant: Taiyo Yuden Co., Ltd., Tokyo (JP)

(72) Inventor: Hirokazu Orimo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/380,128

(22) Filed: Apr. 10, 2019

(65) Prior Publication Data

US 2019/0318874 A1 Oct. 17, 2019

(30) Foreign Application Priority Data

Apr. 12, 2018 (JP) .................. 2018-076505

(51) Int. Cl.
| | |
|---|---|
| H01G 4/01 | (2006.01) |
| H01G 4/232 | (2006.01) |
| H01G 4/30 | (2006.01) |
| H01G 4/012 | (2006.01) |
| H05K 1/11 | (2006.01) |
| H05K 1/18 | (2006.01) |
| H01G 4/248 | (2006.01) |
| H05K 13/04 | (2006.01) |

(52) U.S. Cl.
CPC ........... *H01G 4/2325* (2013.01); *H01G 4/012* (2013.01); *H01G 4/248* (2013.01); *H01G 4/30* (2013.01); *H05K 1/111* (2013.01); *H05K 1/181* (2013.01); *H05K 13/0419* (2018.08); *H05K 2201/10015* (2013.01)

(58) Field of Classification Search
CPC ........ H01G 4/248; H01G 4/2325; H01G 4/30; H01G 4/012; H01G 4/12; H01G 4/232; H01G 2/065; H05K 2201/10015; H05K 1/111; H05K 1/181; H05K 13/0419; H05K 3/3442
USPC .............................................. 361/303, 306.1
See application file for complete search history.

(56) References Cited

U.S. PATENT DOCUMENTS

| | | | | |
|---|---|---|---|---|
| 2012/0007709 | A1* | 1/2012 | Taniguchi | H01G 4/005 336/200 |
| 2016/0141103 | A1* | 5/2016 | Hamanaka | H01G 4/232 361/301.4 |
| 2017/0103853 | A1* | 4/2017 | Zenzai | H01G 4/005 |
| 2018/0286594 | A1* | 10/2018 | Kim | H01G 4/008 |
| 2018/0332715 | A1* | 11/2018 | Woo | H05K 3/341 |

FOREIGN PATENT DOCUMENTS

JP 2013-110239 A 6/2013

OTHER PUBLICATIONS

English Translation JP2013-110239 (Year: 2013).*

* cited by examiner

*Primary Examiner* — Steven T Sawyer
(74) *Attorney, Agent, or Firm* — Chip Law Group

(57) ABSTRACT

A multilayer ceramic capacitor includes an element body in which a dielectric layer and an internal electrode layer are laminated; a first external electrode that is provided at one end of the element body and is connected to a part of the internal electrode layer; and a second external electrode that is provided at an other end of the element body and is connected to that part of the internal electrode layer which is not connected to the first external electrode, in which the first external electrode and the second external electrode each have a linear groove.

9 Claims, 15 Drawing Sheets

MULTILAYER CERAMIC CAPACITOR, PRINTED CIRCUIT BOARD AND PACKAGE

CROSS REFERENCE TO RELATED APPLICATION

This application is based upon and claims benefit of priority from Japanese Patent Application No. 2018-076505, filed on Apr. 12, 2018, the entire contents of which are incorporated herein by reference.

BACKGROUND

The present disclosure relates to a multilayer ceramic capacitor, a printed circuit board on which the multilayer ceramic capacitor is mounted, and a package in which the multilayer ceramic capacitor is accommodated.

In recent years, attendant on the progress of electronization of automobiles, industrial apparatuses and the like, a multilayer ceramic capacitor having high reliability and little variability of characteristics has been demanded as an electronic part which can be mounted on them.

Therefore, improvements of a manufacturing process for suppressing variability of characteristics of the multilayer ceramic capacitor have been under way. For example, in regard of a plating step for forming external electrodes, developments of a technology by which a uniform film with high continuity can be formed have been under way.

The external electrodes of a multilayer ceramic capacitor are formed by a method in which inside metallic plating films covering both end portions of an element body obtained by laminating dielectric layers and internal electrode layers and cutting the laminate are formed, and tin plating films having a high continuity and a uniform thickness are formed covering the inside metallic plating films.

However, when the multilayer ceramic capacitor formed with the external electrodes in this way is exposed to a high-temperature environment at the time of a thermal returning treatment or at the time of reflow, the insulation resistance thereof is lowered.

This arises from thermal diffusion inside the element body of hydrogen taken in at the time of formation of the metallic plating films inside of the external electrodes, under the high-temperature environment.

The thermally diffused hydrogen reduces the dielectric layers in the element body, or becomes charge carriers in the dielectric layers to generate an ion current, which results in a lowering in the insulation resistance of the multilayer ceramic capacitor.

Here, examples of the inside metallic plating film include a copper plating film and a nickel plating film.

Japanese Patent Laid-open No. 2013-110239 (hereinafter, referred to as Patent Document 1) as an example of the related art discloses an electronic part including a nickel plating layer and a tin layer provided over the nickel plating layer, in which the tin layer is provided with opening portions each having a bottom portion, for the purpose of reducing the amount of hydrogen occluded in the nickel plating layer and providing an electronic part which includes an external terminal electrode having a tin layer excellent in solder wettability and in which insulation resistance is hardly deteriorated.

SUMMARY

However, in Patent Document 1, the positions at which the opening portions are formed are not prescribed.

Therefore, for example, if the opening portions are provided throughout the surface of the external electrode, the electronic part may be mounted on a mounting substrate in a state in which the opening portions are not filled up and the plating films inside thereof are exposed.

If the multilayer ceramic capacitor is mounted on the mounting substrate with the opening portions thus left unfilled, moisture or the like would penetrate into the multilayer ceramic capacitor through the opening portions, to affect the element characteristics.

Thus, there is a need for a technology by which the amount of hydrogen in a multilayer ceramic capacitor can be reduced and penetration of moisture or the like after mounting can be prevented.

According to an embodiment of the present disclosure, there is provided a multilayer ceramic capacitor including: an element body in which a dielectric layer and an internal electrode layer are laminated; a first external electrode that is provided at one end of the element body and is connected to a part of the internal electrode layer; and a second external electrode that is provided at an other end of the element body and is connected to that part of the internal electrode layer which is not connected to the first external electrode, in which the first external electrode and the second external electrode each have a linear groove.

In the multilayer ceramic capacitor configured as above, preferably, the first external electrode and the second external electrode each have a plurality of metallic layers laminated, and the linear groove penetrates an outermost layer of each of the first external electrode and the second external electrode.

In the multilayer ceramic capacitor configured as above, preferably, the outermost layer of each of the first external electrode and the second external electrode is a metallic layer containing tin as a main constituent.

In the multilayer ceramic capacitor configured as above, preferably, the first external electrode and the second external electrode each include a nickel plating film or a copper plating film therein.

According to another embodiment of the present disclosure, there is provided a printed circuit board including a land pattern to which external electrodes of a multilayer ceramic capacitor are joined by a solder, in which the grooves of the external electrodes are filled with the solder.

In the printed circuit board configured as above, preferably, the linear groove is provided below a center in a height direction of each of the first external electrode and the second external electrode, with a mounting surface to which the multilayer ceramic capacitor is mounted as a reference.

According to a further embodiment of the present disclosure, there is provided a package in which a carrier tape provided with a recess for accommodating a multilayer ceramic capacitor and a cover tape are adhered to each other.

In the package configured as above, preferably, the linear groove is provided at a position deviated from a center in a height direction of each of the first external electrode and the second external electrode, and the groove is located on a side of a bottom of the recess of the carrier tape.

In accordance with the present disclosure, the amount of hydrogen present inside a multilayer ceramic capacitor can be reduced, and penetration of moisture or the like after mounting can be prevented.

DETAILED DESCRIPTION OF THE PREFERRED EMBODIMENT

Figure 1:
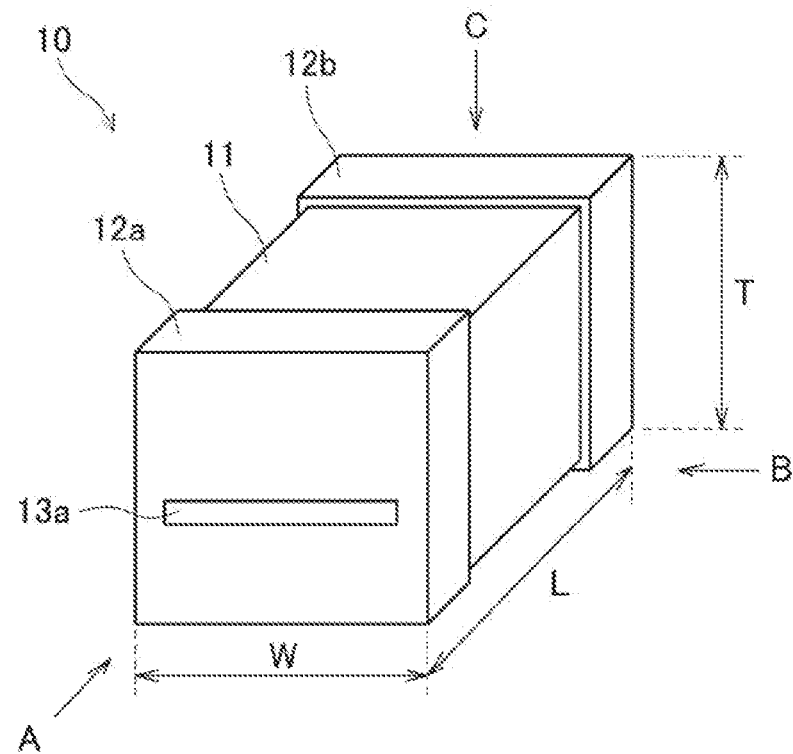
FIG. 1 is a perspective view of a multilayer ceramic capacitor according to an embodiment of the present disclosure.

An embodiment of the present disclosure will be described below, referring to the drawings.

It is to be noted, however, that the present disclosure is not to be limitedly construed due to the following description of the embodiment.

<Embodiment>

FIG. 1 is a perspective view of a multilayer ceramic capacitor 10 according to the present embodiment.

Figure 2A:
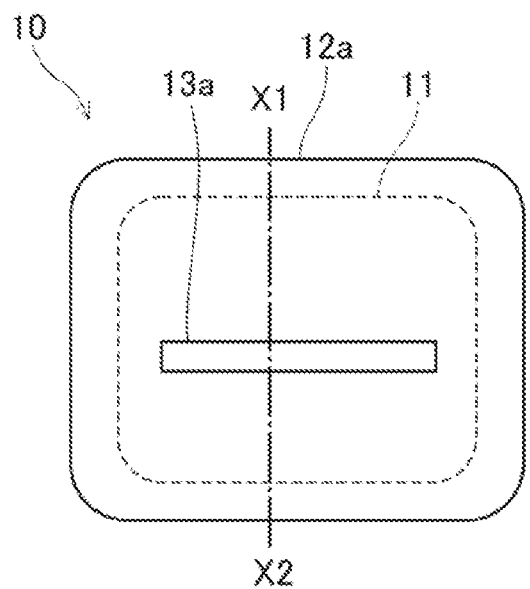
FIG. 2A is a view along arrow A of FIG. 1, of the multilayer ceramic capacitor depicted in FIG. 1.
Figure 2B:
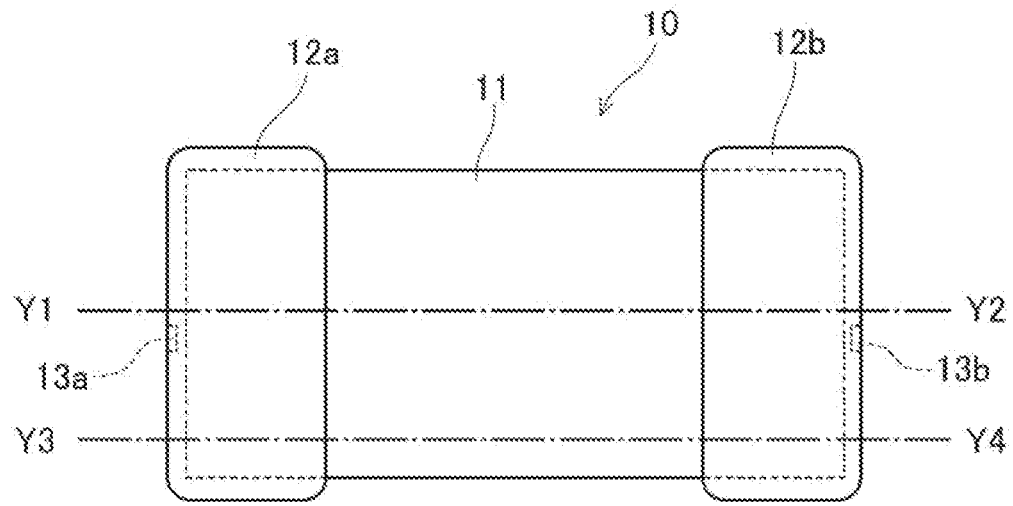
FIG. 2B is a view along arrow B of FIG. 1, of the multilayer ceramic capacitor depicted in FIG. 1.
Figure 2C:
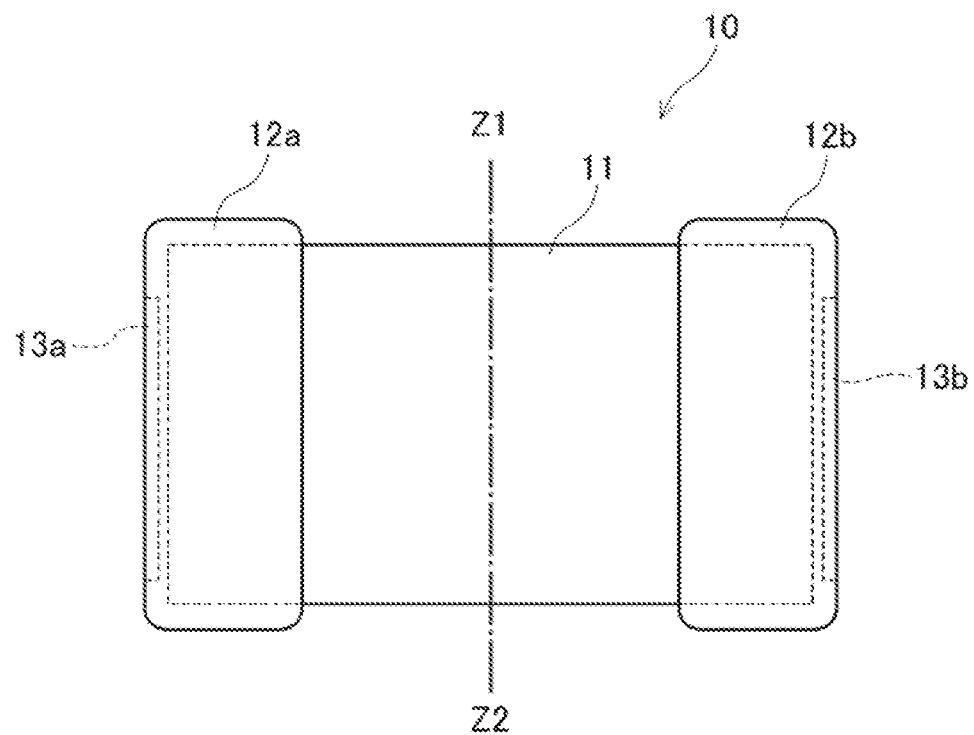
FIG. 2C is a view along arrow C of FIG. 1, of the multilayer ceramic capacitor depicted in FIG. 1.

FIG. 2A is a view along arrow A of FIG. 1, of the multilayer ceramic capacitor 10 depicted in FIG. 1, FIG. 2B is a view along arrow B of FIG. 1, of the multilayer ceramic capacitor 10 depicted in FIG. 1, and FIG. 2C is a view along arrow C of FIG. 1, of the multilayer ceramic capacitor 10 depicted in FIG. 1.

In the multilayer ceramic capacitor 10, an external electrode 12a is provided at one end in regard of a direction L of an element body 11, and an external electrode 12b is provided at the other end.

The external electrode 12a is provided covering one end in regard of the direction L of the element body 11, and the external electrode 12b is provided covering the other end in regard of the direction L of the element body 11.

The external electrode 12a is provided with a liner groove 13a, and the external electrode 12b is provided with a linear groove 13b.

Note that when discriminating the external electrode 12a and the external electrode 12b from each other, the external electrode 12a is referred to as a first external electrode, while the external electrode 12b is referred to as a second external electrode; however, the external electrode 12a may be referred to as the second external electrode, and the external electrode 12b may be referred to as the first external electrode.

In addition, the area ratios of the grooves 13a and 13b are each not less than 1% and less than 12%, preferably not less than 3% and less than 12%, based on the surface in which the groove is formed (formation surface).

Further, it is recommendable that in the longitudinal direction, each of the grooves 13a and 13b is within a range defined by the points spaced respectively from both ends of the formation surface by 20% of the length of the formation surface in this direction, and it is preferable that each of the grooves 13a and 13b is within a range defined by the points spaced respectively from both ends of the formation surface by 35% of the length of the formation surface in this direction.

Figure 3A:
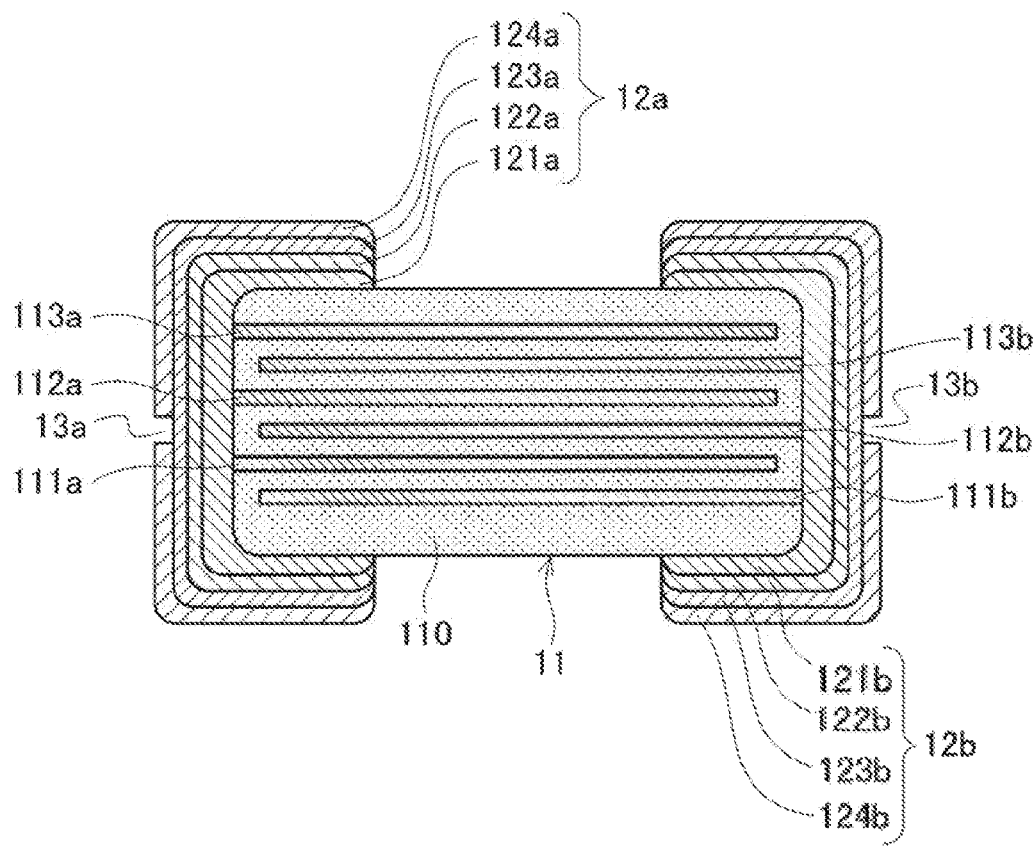
FIG. 3A is a sectional view of the multilayer ceramic capacitor, taken along line X1-X2 of FIG. 2A.
Figure 3B:
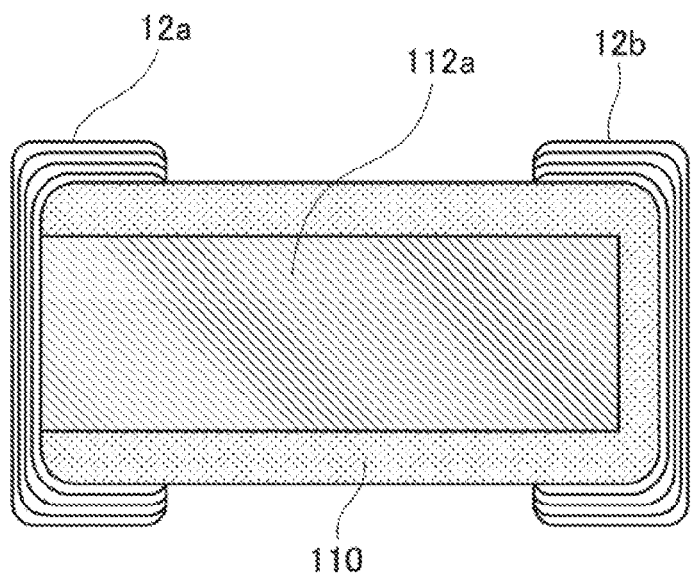
FIG. 3B is a sectional view of the multilayer ceramic capacitor, taken alone line Y1 -Y2 of FIG. 2B.
Figure 3C:
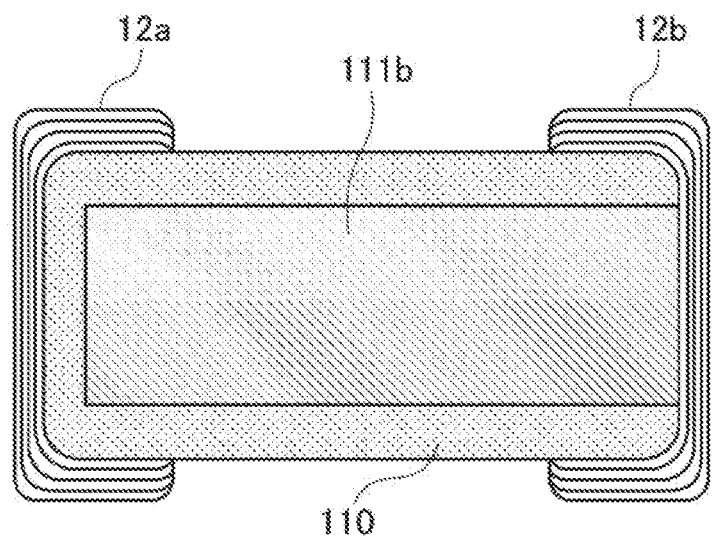
FIG. 3C is a sectional view of the multilayer ceramic capacitor, taken along line Y3-Y4 of FIG. 2B.

FIG. 3A is a sectional view of the multilayer ceramic capacitor 10, taken along line X1-X2 of FIG. 2A; FIG. 3B is a sectional view of the multilayer ceramic capacitor 10, taken alone line Y1-Y2 of FIG. 2B; FIG. 3C is a sectional view of the multilayer ceramic capacitor 10, taken along line Y3-Y4 of FIG. 2B; and FIG. 3D is a sectional view of the multilayer ceramic capacitor 10, taken along line Z1-Z2 of FIG. 2C.

Figure 3D:
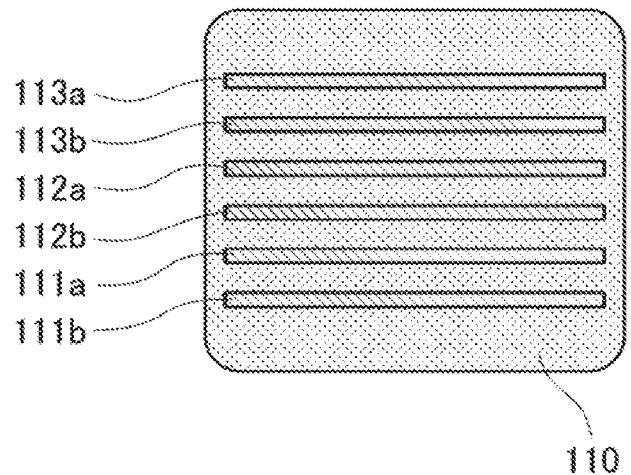
FIG. 3D is a sectional view of the multilayer ceramic capacitor, taken along line Z1-Z2 of FIG. 2C.

In the element body 11, as illustrated in FIGS. 3A and 3D, an internal electrode layer 111a, an internal electrode layer 111b, an internal electrode layer 112a, an internal electrode layer 112b, an internal electrode layer 113a and an internal electrode layer 113b are laminated in this order, and dielectric layers 110 are provided between these internal electrode layers and on the outer sides of these internal electrode layers.

The internal electrode layer 111a, the internal electrode layer 112a and the internal electrode layer 113a are connected to the external electrode 12a, as illustrated in FIG. 3B, whereas the internal electrode layer 111b, the internal electrode layer 112b and the internal electrode layer 113b are connected to the external electrode 12b as depicted in FIG. 3C.

Thus, two internal electrode layers adjacently facing each other are connected respectively to the different external electrodes, whereby a capacitance generating section is formed.

The dielectric layers 110 are formed from a dielectric ceramic material such as barium titanate ($BaTiO3$), strontium titanate ($SrTiO3$), calcium titanate ($CaTiO3$), magnesium titanate ($MgTiO3$), calcium zirconate ($CaZrO3$), calcium zirconate titanate ($CaZrTiO3$), barium zirconate ($BaZrO3$), or titanium oxide ($TiO2$).

It is to be noted, however, that the material for forming the dielectric layer 110 is not limited to the materials mentioned here as examples.

The internal electrode layer 111a, the internal electrode layer 111b, the internal electrode layer 112a, the internal electrode layer 112b, the internal electrode layer 113a and the internal electrode layer 113b are formed by use of a metallic material such as nickel, copper, palladium, platinum, silver, gold and their alloys.

It is to be noted, however, that the material for forming the internal electrode layers is not limited to the materials mentioned here as examples.

The external electrode 12a includes: a first external electrode layer 121a provided in contact with the element body 11 and connected to the internal electrode layers 111a, 112a and 113a; a second external electrode layer 122a provided covering the first external electrode layer 121a; a third external electrode layer 123a provided covering the second external electrode layer 122a; and a fourth external electrode layer 124a provided covering the third external electrode layer 123a.

The external electrode 12b includes: a first external electrode layer 121b provided in contact with the element body 11 and connected to the internal electrode layers 111b, 112b and 113b; a second external electrode layer 122b provided covering the first external electrode layer 121b; a third external electrode layer 123b provided covering the second external electrode layer 122b; and a fourth external electrode layer 124b provided covering the third external electrode layer 123b.

Here, the first external electrode layers 121a and 121b are formed using a nickel paste, the second external electrode layers 122a and 122b are formed by copper plating, the third external electrode layers 123a and 123b are formed by nickel plating, and the fourth external electrode layers 124a and 124b are formed by tin plating.

It is to be noted, however, that the materials for forming the external electrode layers are not limited to these materials, and the external electrode layers may be formed by use of such a metallic material as palladium, platinum, silver or gold.

Alternatively, alloys of nickel, copper, palladium, platinum, silver, gold or tin may be used.

Further, the materials for forming the external electrode layers are not limited to the materials mentioned here as examples.

Figure 4:
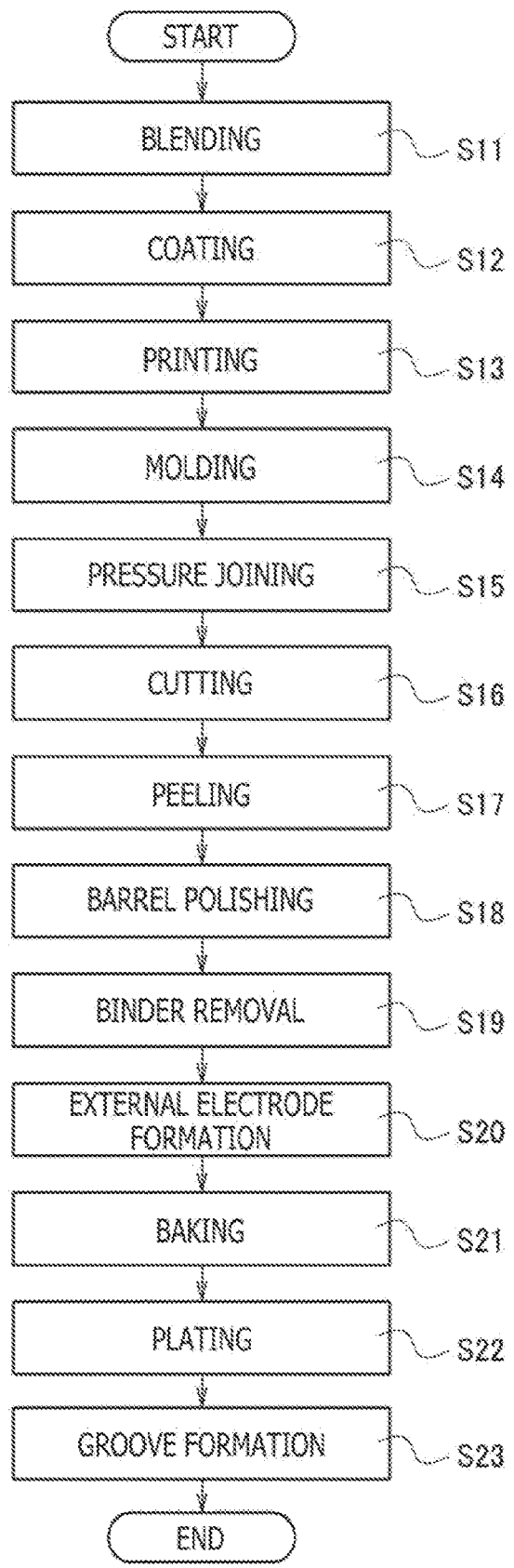
FIG. 4 is a flow chart depicting a method for producing the multilayer ceramic capacitor illustrated in FIG. 1.

FIG. 4 is a flow chart depicting a method for producing the multilayer ceramic capacitor 10 illustrated in FIG. 1.

First, to a ceramic powder as a material for forming a dielectric are added a dispersant or an organic binder, and an organic solvent, followed by crushing and mixing, to produce a muddy slurry (S11: blending step).

Here, the organic binder is a forming assistant, and examples of the organic binder include polyvinyl butyral resins and polyvinyl acetal resins.

Next, the muddy slurry is applied to carrier films in a sheet form, followed by drying to produce a plurality of green sheets (S12: coating step).

Here, examples of the slurry applying method include a doctor blade method, a die coater method, and a gravure coater method.

In addition, examples of the carrier film include a polyethylene terephthalate (PET) film.

Subsequently, to a green sheet for forming the internal electrode, of the plurality of green sheets, a conductive paste for forming the internal electrode is applied in a predetermined pattern, to thereby form a pattern of the internal electrode (S13: printing step).

Here, examples of the method for applying the conductive paste include a screen printing method, an ink jet printing method and a gravure printing method.

Besides, examples of the conductive material contained in the conductive paste include nickel and copper.

Next, the green sheets formed with the internal electrode pattern and the green sheets for outer layers that are not formed with the internal electrode pattern are laminated in a predetermined order, to produce a laminated sheet (S14: molding step).

Subsequently, the laminated sheet obtained in the molding step is pressed (S15: pressure joining step).

Here, for example, a block of the laminated sheet pressure joined is sandwiched between resin films, and the assembly is subjected to isostatic pressing.

Next, the laminated sheet thus pressed is cut, to thereby individualize the laminated sheet into rectangular parallelepiped laminates (S16: cutting step).

The rectangular parallelepiped laminates thus individualized are held by a holding member.

Here, the cutting may be, for example, cutting by a hand push cutter or cutting by a rotary knife.

In addition, a tape may be mentioned as an example of the holding member.

Subsequently, the individualized laminates are peeled off from the holding member (S17: peeling step).

Next, the individualized laminates are put into a vessel for barrel polishing together with a surfactant aqueous solution and an abrasive, and the vessel is rotated, to cause the abrasive and the laminates to collide against each other, thereby polishing the laminates (S18: barrel polishing step).

By this step, adhesion between the laminates and the external electrodes is enhanced, and chipping of corner portions of the laminates can be prevented.

Subsequently, the laminates after the barrel polishing are heated to remove the organic binder (S19: binder removal step).

Here, the heating for removing the organic binder is conducted, for example, at approximately 350° C. in a nitrogen atmosphere.

Next, a conductive paste is applied to both end faces of the laminate from which the organic binder has been removed, and the paste is dried (S20: external electrode formation step).

This conductive paste becomes the first external electrode layers 121a and 121b after baking; here, a nickel paste is applied, and dried.

Subsequently, the laminate is baked in a baking furnace, to form the element body 11 (S21: baking step).

This baking is conducted, for example, at a temperature of 1,000° C. to 1,350° C. for a time of ten minutes to two hours.

By this step, the element body 11 is produced as a laminated sintered body in which the dielectric layers formed from a ceramic material and the internal electrode layers are united and which has the first external electrode layers 121a and 121b.

Note that in the case where the internal electrode layers are formed from a base metal of nickel or copper, a reducing atmosphere is established in the furnace at the time of baking, for preventing oxidation of the internal electrode layers.

Next, plating films to be the second external electrode layers 122a and 122b, the third external electrode layers 123a and 123b and the fourth external electrode layers 124a and 124b are formed on the first external electrode layers 121a and 121b of the element body 11 formed through the baking (S22: plating step).

Here, a copper plating film is formed on the sintered nickel paste, a nickel plating film is formed on the copper plating film, and a tin plating film is formed on the nickel plating film.

Specifically, a plurality of the element bodies sintered after the application of the nickel paste are accommodated in a barrel together with a plating solution, and a current is passed while the barrel is being rotated, whereby these plating films can be formed on the sintered nickel paste.

Note that the nickel plating film can enhance thermal resistance of the external electrodes 12a and 12b, whereas the tin plating film can enhance wettability of solder.

Note that the external electrode formation step S20 of applying the nickel paste may be carried out after the baking step S21.

In that case, heating for sintering the nickel paste is additionally performed.

Subsequently, the multilayer ceramic capacitor produced as aforementioned is formed with the grooves 13a and 13b (S23: groove formation step).

Figure 5:
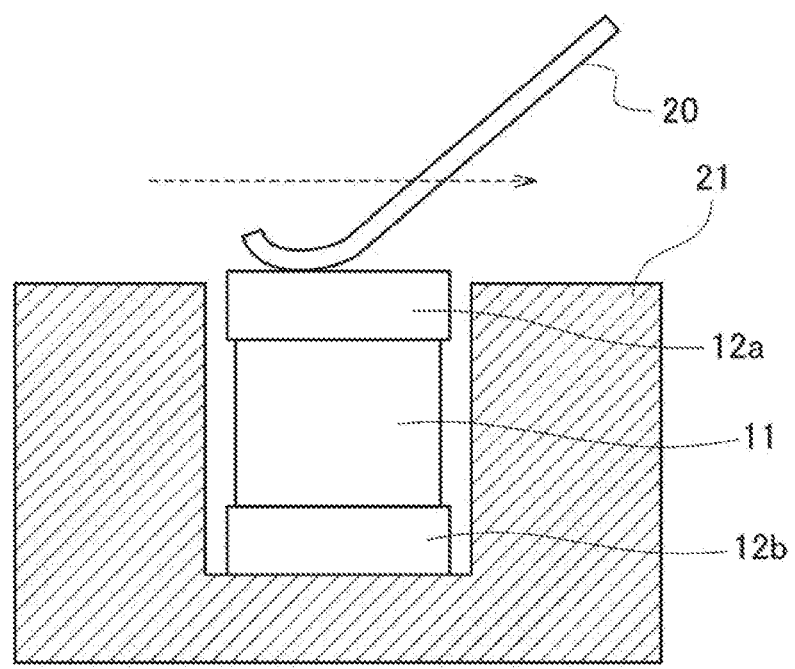
FIG. 5 is a figure depicting a method for forming a groove illustrated in FIG. 1.

FIG. 5 is a figure depicting a method for forming the groove 13a illustrated in FIG. 1.

As depicted in FIG. 5, the element body 11 provided with the external electrodes 12a and 12b respectively at both end portions thereof is fixed to a jig 21, and a tool 20 put in contact with the external electrode 12a is moved in the direction of the dotted-line arrow to rub the surface of the external electrode 12a, whereby the groove 13a is formed.

In addition, the groove 13b is formed in the external electrode 12b after the formation of the groove 13a in the external electrode 12a, in the same manner as the groove 13a.

The tool 20 has curved line formed at its contact surface for contact with the external electrode 12a, such as to prevent the grooves 13a and 13b from being formed in an excessive depth to damage the element body 11, and is, for example, a curved metal.

The jig 21 has a recess in which the element body 11 provided with the external electrodes 12a and 12b can be fitted.

The bottom of the recess has a shape and an area such that a surface formed entirely with the external electrode 12a or the external electrode 12b can be housed, and the depth of the recess is set to be slightly smaller, for example, by approximately 1 mm, than the length in the L direction of the multilayer ceramic capacitor 10 depicted in FIG. 1.

This ensures a state in which the external electrode 12a or the external electrode 12b slightly protrudes from the jig 21, and the step of rubbing the external electrode 12a or the external electrode 12b by the tool 20 can be performed smoothly.

It is to be noted, however, that the tool 20 and the jig 21 are not limited to the forms depicted in FIG. 5.

Here, in the case where the thickness of the second eternal electrode layers 122a and 122b is 5 μm, the thickness of the third external electrode layers 123a and 123b is 3 μm and the thickness of the fourth external electrode layers 124a and 124b is 5 μm, the depths of the grooves 13a and 13b to be formed may be, for example, 1 to 10 μm, preferably 3 to 8 μm, and more preferably 6 to 7 μm.

It is to be noted, however, that the grooves 13a and 13b are not limited to this, and may be formed to be shallower or deeper, as will be described later.

As has been described above, the multilayer ceramic capacitor 10 depicted in FIG. 1 can be produced.

When the multilayer ceramic capacitor 10 produced in this way is subjected to tests such as an insulation resistance test, polarization of the dielectric may occur, leading to a lowering in capacitance.

In order to recover the capacitance thus lowered, the multilayer ceramic capacitor 10 is subjected to a thermal returning treatment of heating to or above a Curie point.

The Curie point differs depending on the forming material, and, for example, heating to 150° C. is adopted.

This ensures that hydrogen contained in the multilayer ceramic capacitor 10, specifically, in the metal plating film inside the external electrode is released through the groove in the external electrode.

Meanwhile, the groove 13a formed in the multilayer ceramic capacitor 10 depicted in FIG. 1 is provided at the center in regard of the height direction of the multilayer ceramic capacitor 10, but the multilayer ceramic capacitor according to the present disclosure is not limited to this configuration.

Figure 6A:
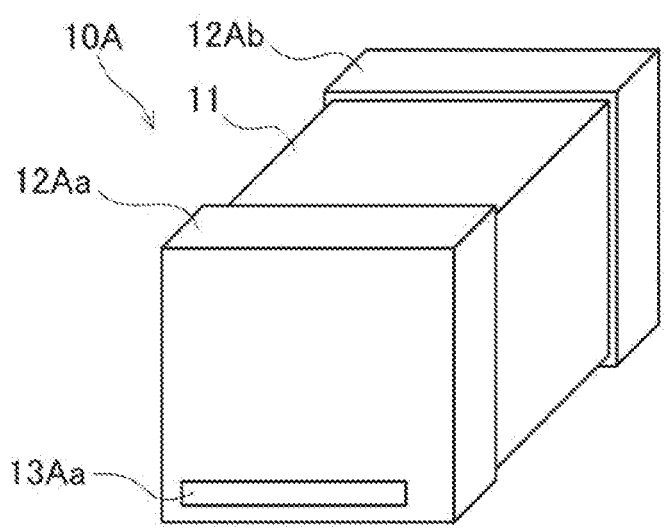
FIG. 6A is a figure depicting a groove formed in the multilayer ceramic capacitor according to a first modification of the embodiment.

FIG. 6A is a figure depicting a groove 13Aa formed in a multilayer ceramic capacitor 10A according to a first modification of the present embodiment.

The groove 13Aa is linear and rectilinear in shape.

In the multilayer ceramic capacitor 10A depicted in FIG. 6A, an external electrode 12Aa provided with the groove 13Aa is provided covering one end portion of an element body 11.

Besides, an external electrode 12Ab provided with a similar groove is provided covering the other end portion of the element body 11.

In the multilayer ceramic capacitor 10A depicted in FIG. 6A, the groove 13Aa is formed at a lower position, or on the side of a mounting surface serving as a reference surface, as compared to the groove 13a of the multilayer ceramic capacitor 10 depicted in FIG. 1.

In the multilayer ceramic capacitor 10A depicted in FIG. 6A, the solder enters the groove 13Aa even in the case where the height by which a solder fillet is wetting upward at the time of mounting is low.

Therefore, in the multilayer ceramic capacitor 10A, strength in bonding to the printed circuit board as a mounting substrate can be secured even in the case where the amount of the solder is small.

Figure 6B:
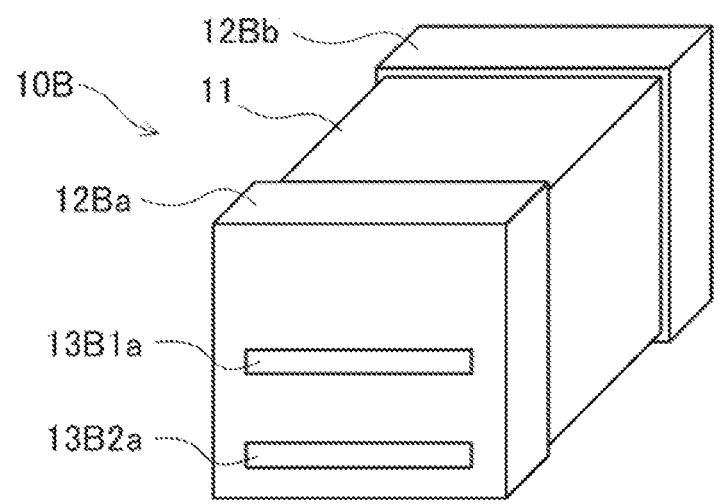
FIG. 6B is a figure depicting a groove formed in the multilayer ceramic capacitor according to a second modification of the embodiment.

FIG. 6B is a figure depicting grooves 13B1a and 13B2a formed in a multilayer ceramic capacitor 10B according to a second modification of the present embodiment.

The groove 13B1a and the groove 13B2a are linear and rectilinear in shape.

In the multilayer ceramic capacitor 10B depicted in FIG. 6B, an external electrode 12Ba provided with the grooves 13B1a and 13B2a is provided covering one end portion of an element body 11.

Besides, an external electrode 12Bb provided with similar grooves is provided covering the other end portion of the element body 11.

In the multilayer ceramic capacitor 10B depicted in FIG. 6B, the groove 13B1a is formed in the center in regard of the height direction of the multilayer ceramic capacitor 10B, like the groove 13a depicted in FIG. 1, and the groove 13B2a is formed on the side of the mounting surface as the reference surface of the multilayer ceramic capacitor 10B, like the groove 13Aa depicted in FIG. 6A.

In the multilayer ceramic capacitor 10B depicted in FIG. 6B, the solder enters the groove 13B2a even in the case where the height by which a solder fillet is wetting upward at the time of mounting is low, and, further, the solder enters also the groove 13B1a depending on the height by which the solder fillet is wetting upward at the time of mounting.

Therefore, in the multilayer ceramic capacitor 10B, strength in boding to the printed circuit board as the mounting substrate can be secured even in the case where the amount of the solder is small, and, moreover, the strength in boding to the printed circuit board as the mounting substrate can be enhanced depending on the amount of the solder.

Figure 6C:
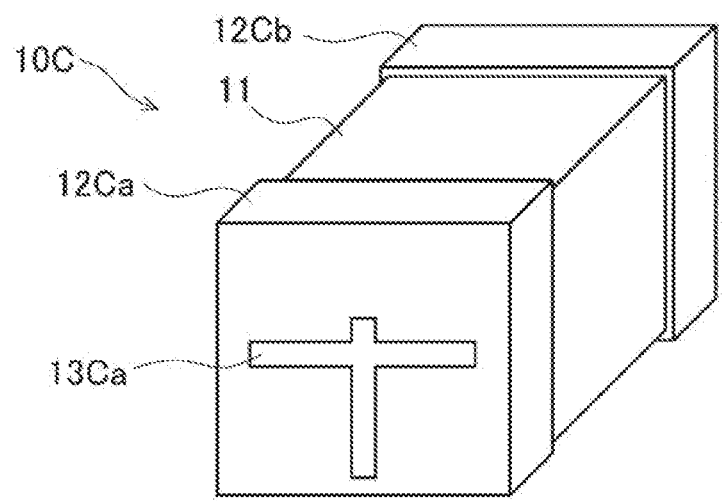
FIG. 6C is a figure depicting a groove formed in the multilayer ceramic capacitor according to a third modification of the embodiment.

FIG. 6C is a figure depicting a groove 13Ca formed in a multilayer ceramic capacitor 10C according to a third modification of the present embodiment.

The groove 13Ca is liner and rectilinear in shape.

In the multilayer ceramic capacitor 10C depicted in FIG. 6C, an external electrode 12Ca provided with the groove 13Ca is provided covering one end portion of an element body 11.

Besides, an external electrode 12Cb provided with a similar groove is provided covering the other end portion of the element body 11.

In the multilayer ceramic capacitor 10C depicted in FIG. 6C, a groove extending substantially in parallel to the mounting surface direction and a groove extending in the height direction intersect each other, to form a cross-shaped groove 13Ca.

In the multilayer ceramic capacitor 10C depicted in FIG. 6C, also, the groove 13Ca can be formed in such a manner that the solder enters the groove 13Ca.

Figure 6D:
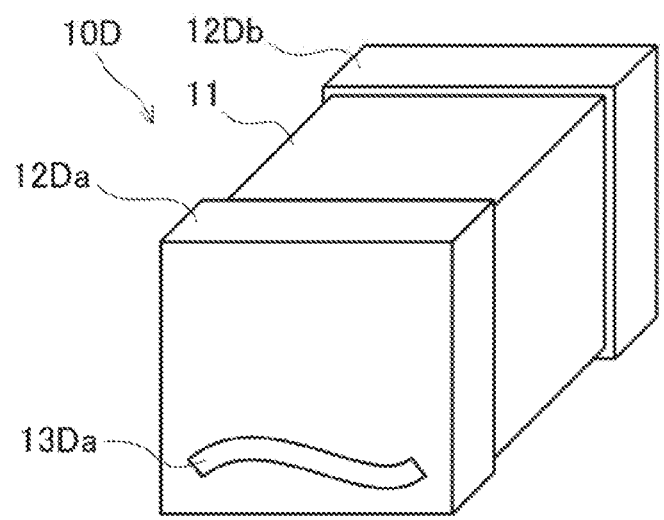
FIG. 6D is a figure depicting a groove formed in the multilayer ceramic capacitor according to a fourth modification of the embodiment.

FIG. 6D is a figure depicting a groove 13Da formed in a multilayer ceramic capacitor 10D according to a fourth modification of the present embodiment.

The groove 13Da is linear and includes a curved portion.

In the multilayer ceramic capacitor 10D depicted in FIG. 6D, an external electrode 12Da provided with the groove 13Da is provided covering one end portion of an element body 11.

Besides, an external electrode 12Db provided with a similar groove is provided covering the other end portion of the element body 11.

In the multilayer ceramic capacitor 10D depicted in FIG. 6D, by adopting the groove 13Da which includes a curved portion, a number of grooves can be formed within a predetermined range; therefore, hydrogen present inside the multilayer ceramic capacitor can be reduced, and, with a larger amount of solder can enter the groove 13Da, strength in boding to the printed circuit board after mounting can be further enhanced.

The sectional shape and depth of the groove provided in the external electrode of the multilayer ceramic capacitor according to the present embodiment will be described below.

Note that in FIGS. 7A, 7B, 7C, 7D and 7E in the following, only the element body of the multilayer ceramic capacitor and the external electrode on one side of the element body are illustrated, the external electrode is illustrated in an enlarged form, and the other external electrode is omitted from illustration.

Figure 7A:
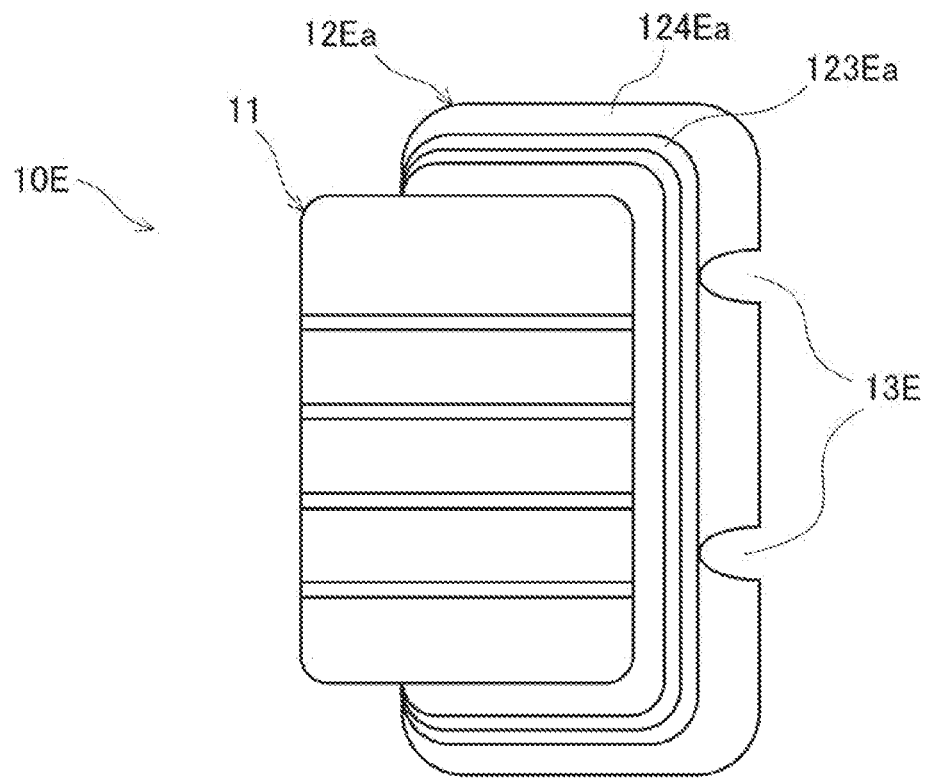
FIG. 7A is a figure depicting a sectional shape of the groove formed in the multilayer ceramic capacitor according to the embodiment.

FIG. 7A is a figure depicting a sectional shape of grooves 13E formed in a multilayer ceramic capacitor 10E according to the present embodiment.

The grooves 13E of an external electrode 12Ea depicted in FIG. 7A are in the shape of a curved line in the sectional view, and are formed to penetrate an outermost fourth external electrode layer 124Ea and to reach a third external electrode layer 123Ea.

Note that while the two grooves 13E are formed in FIG. 7A, this is not limitative, and only one groove 13E may be formed, or three or more grooves 13E may be formed.

Figure 7B:
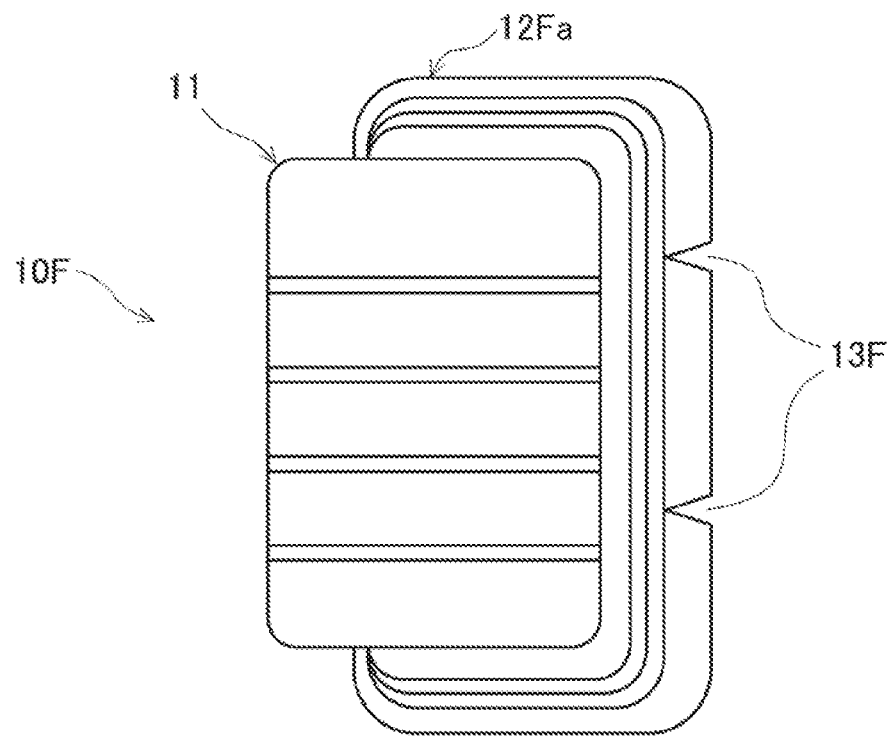
FIG. 7B is a figure depicting a sectional shape of the groove formed in the multilayer ceramic capacitor according to the embodiment.

FIG. 7B is a figure depicting a sectional shape of grooves 13F formed in a multilayer ceramic capacitor 10F according to the present embodiment.

The grooves 13F of an external electrode 12Fa depicted in FIG. 7B are in the shape of a wedge in the sectional view.

Note that the two grooves 13F are formed in FIG. 7B, this is not limitative, and only one groove 13F may be formed, or three or more grooves 13F may be formed.

Figure 7C:
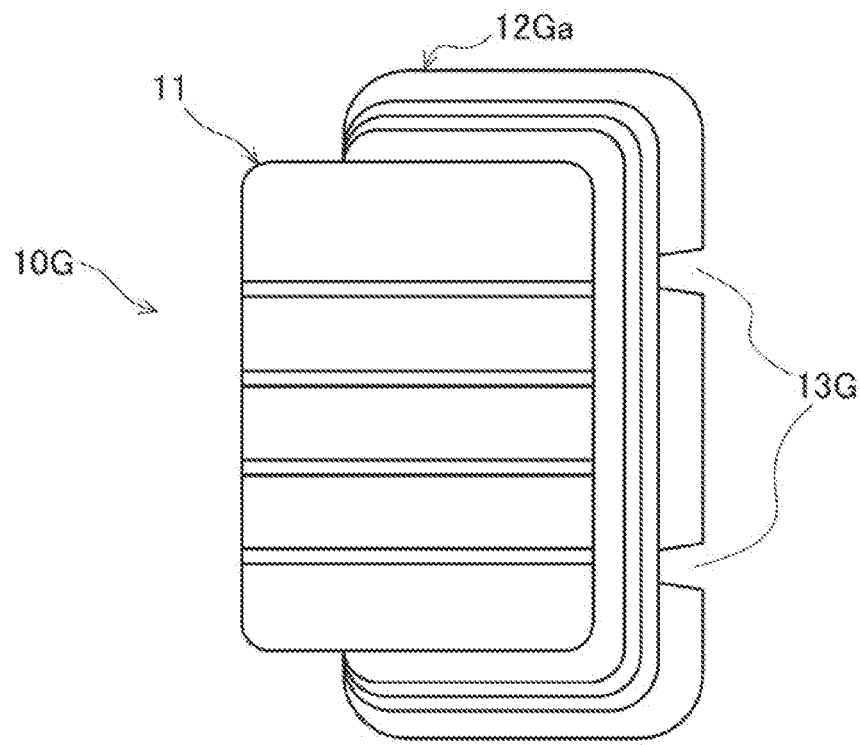
FIG. 7C is a figure depicting a sectional shape of the groove formed in the multilayer ceramic capacitor according to the embodiment.

FIG. 7C is a figure depicting a sectional shape of grooves 13G formed in a multilayer ceramic capacitor 10G according to the present embodiment.

The grooves 13G of an external electrode 12Ga depicted in FIG. 7C are in the shape of a trapezoid in the sectional view.

Note that while the two grooves 13G are formed in FIG. 7C, this is not limitative, and only one groove 13G may be formed, or three or more grooves 13G may be formed.

Figure 7D:
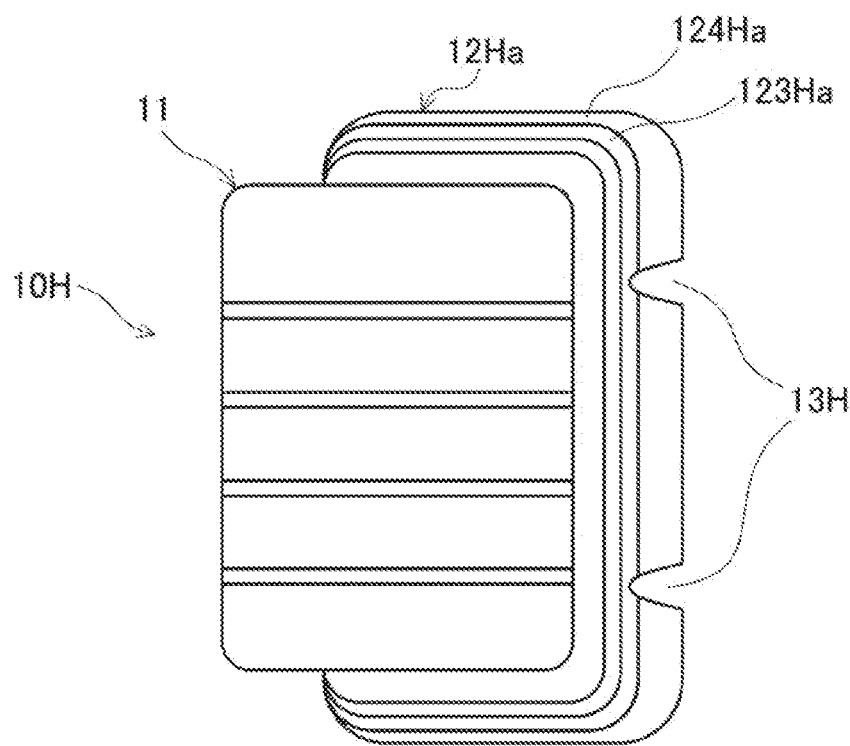
FIG. 7D is a figure depicting a sectional shape of the groove formed in the multilayer ceramic capacitor according to the embodiment.

FIG. 7D is a figure depicting a sectional shape of grooves 13H formed in a multilayer ceramic capacitor 10H according to the present embodiment.

The grooves 13H of an external electrode 12Ha depicted in FIG. 7D are in the shape of a curved line in the sectional view, and are provided such as to penetrate an outermost fourth external electrode layer 124Ha and to expose and shave part of a third external electrode layer 123Ha.

As illustrated in FIG. 7D, the grooves 13H penetrate the fourth external electrode layer 124Ha and expose part of the third external electrode layer 123Ha, whereby hydrogen present inside an external electrode 12Ha can be removed efficiently.

Note that while the two grooves 13H are formed in FIG. 7D, this is not limitative, and only one groove 13H may be formed, or three or more grooves 13H may be formed.

Figure 7E:
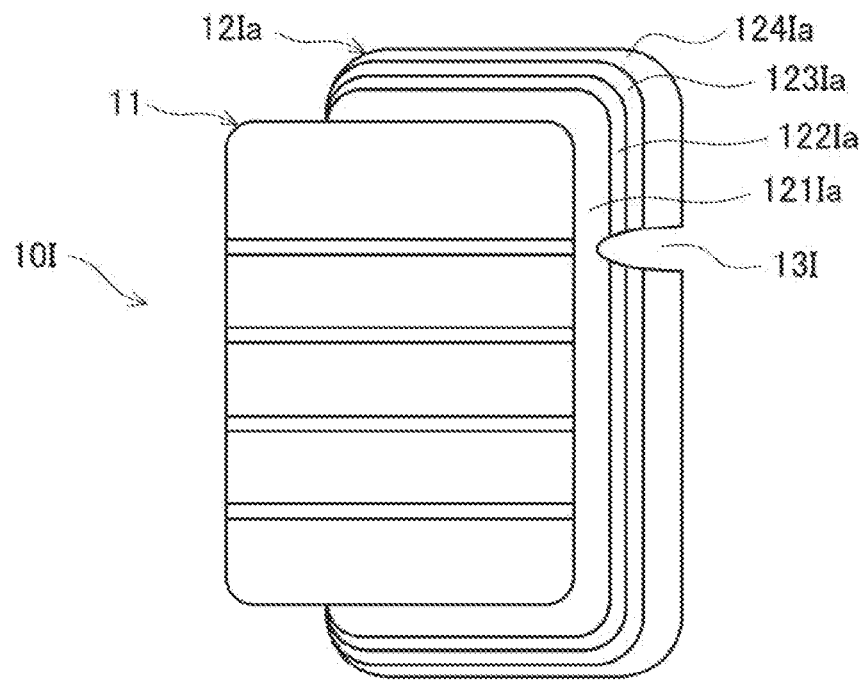
FIG. 7E is a figure depicting a sectional shape of the groove formed in the multilayer ceramic capacitor according to the embodiment.

FIG. 7E is a figure depicting a sectional shape of a groove 13I formed in a multilayer ceramic capacitor 10I according to the present embodiment.

The groove 13I of an external electrode layer 12Ia depicted in FIG. 7E is in the shape of a curved line in the sectional view, and is provided such as to penetrate a fourth external electrode layer 124Ia, a third external electrode layer 123Ia and a second external electrode layer 122Ia and to expose and shave part of a first external electrode layer 121Ia .

As illustrated in FIG. 7E, the groove 13I is formed such as to penetrate the fourth external electrode layer 124Ia the third external electrode layer 123Ia and the second external electrode layer 122Ia and to expose part of the first external electrode layer 121Ia, whereby hydrogen present inside an external electrode 12Ia can be removed further efficiently.

Note that while the one groove 13I is formed in FIG. 7E, this is not limitative, and two or more grooves 13I may be formed.

Figure 7F:
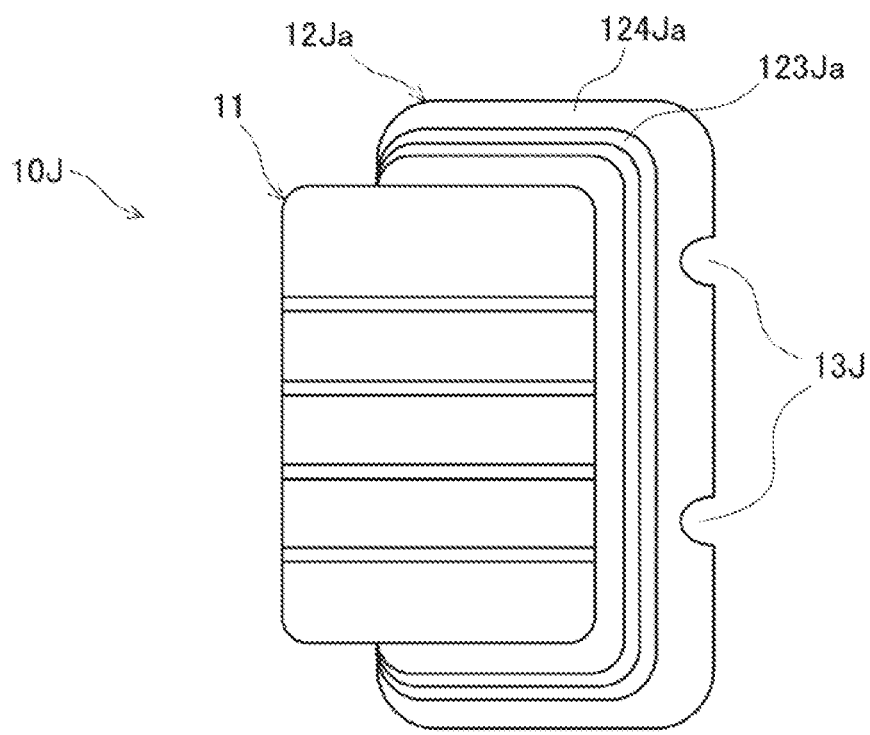
FIG. 7F is a figure depicting a sectional shape of the groove formed in the multilayer ceramic capacitor according to the embodiment.

FIG. 7F is a figure depicting a sectional shape of a modification of grooves 13J formed in a multilayer ceramic capacitor 10J according to the present embodiment.

As illustrated in FIG. 7F, the grooves 13J of an external electrode 12Ja may be formed only in an outermost fourth external electrode layer 124Ja without exposing a third external electrode layer 123Ja; in this case, notwithstanding the third external electrode layer 123Ja is not exposed, hydrogen present in the third external electrode layer 123Ja can be removed.

Further, since the grooves 13J do not penetrate the outermost fourth external electrode layer 124Ja, excellent solder wettability is ensured by this configuration.

Note that in the case where the grooves are wedge-shaped in the sectional view as depicted in FIG. 7B or in the case where the grooves are trapezoidal in shape in the sectional view as depicted in FIG. 7C, also, the grooves may be provided such as to penetrate the outermost fourth external electrode layer and to expose and shave part of the third external electrode layer, the second external electrode layer or the first external electrode layer, as depicted in FIG. 7D or 7E.

In addition, in any of the sectional shapes, the grooves may not penetrate the outermost external layer, like in FIG. 7F.

In that case, excellent solder wettability is ensured by the configuration.

As illustrated in FIGS. 7A, 7B, 7C, 7D, 7E and 7F, the sectional shape of the grooves provided in the multilayer ceramic capacitor according to the present embodiment is not limited to specific shapes.

Figure 8:
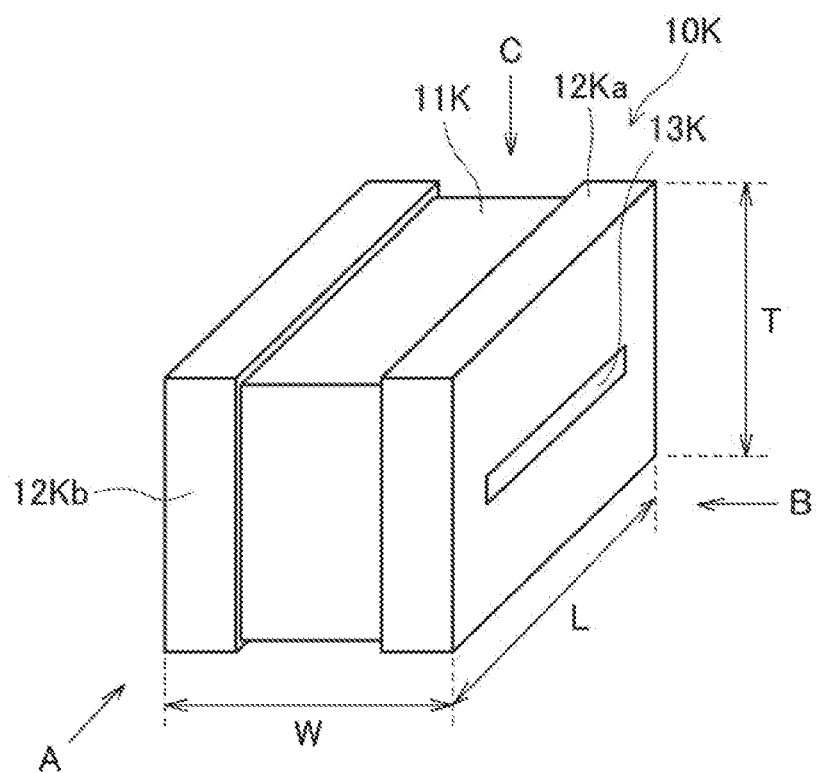
FIG. 8 is a perspective view of a multilayer ceramic capacitor according to a modification of the embodiment.

FIG. 8 is a perspective view of a multilayer ceramic capacitor 10K according to a modification of the present embodiment.

The multilayer ceramic capacitor 10K depicted in FIG. 8 has a structure in which the corresponding relations between the length direction and width direction of an element body and surfaces provided with external electrodes are reversed as compared to those of the multilayer ceramic capacitor 10 depicted in FIG. 1.

In the multilayer ceramic capacitor 10K depicted in FIG. 8, an external electrode 12Ka is provided covering one end portion in regard of the W direction of an element body 11K, an external electrode 12Kb is provided covering the other end portion in regard of the W direction of the element body 11K, and the external electrode 12Ka is provided with a groove 13K.

Besides, though not illustrated, the external electrode 12Kb is also provided with a similar groove.

In the multilayer ceramic capacitor 10K thus depicted in FIG. 8, also, hydrogen can be removed through the grooves formed in the external electrodes.

In the multilayer ceramic capacitors according to the present embodiment as described above, the external electrodes are mounted, by soldering, onto the printed circuit board serving as a mounting substrate.

A mounting example of the multilayer ceramic capacitor according to the present embodiment will be described below.

Figure 9A:
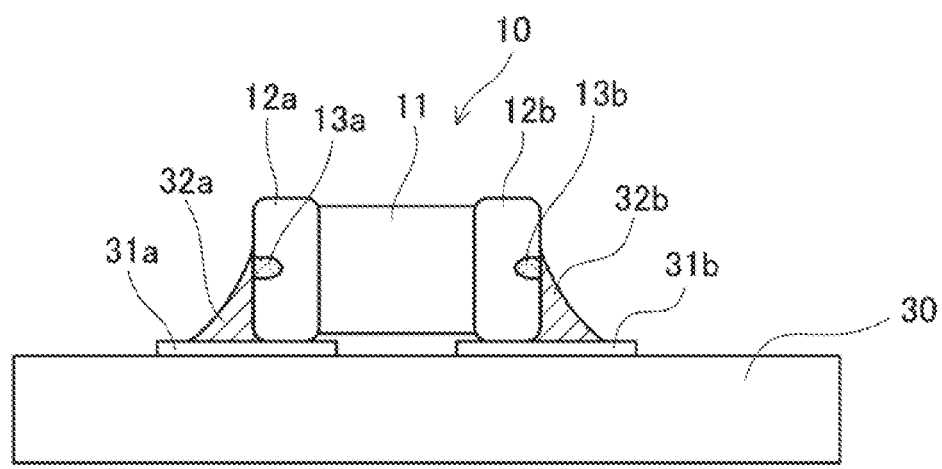
FIG. 9A is a figure depicting a mounting example of the multilayer ceramic capacitor according to the embodiment.

FIG. 9A is a figure depicting a mounting example of the multilayer ceramic capacitor 10 according to the present embodiment.

In FIG. 9A, there are depicted land patterns 31a and 31b provided spaced from each other on a printed circuit board 30, the multilayer ceramic capacitor 10 having the external electrodes 12a and 12b provided respectively at both end portions of the element body 11, a solder fillet 32a provided in contact with the external electrode 12a and the land pattern 31a, and a solder fillet 32b provided in contact with the external electrode 12b and the land pattern 31b.

The external electrode 12a of the multilayer ceramic capacitor 10 is provided with a groove 13a, and the external electrode 12b is provided with a groove 13b. Since the solder is used in appropriate amounts, the solder fillet 32a enters into the groove 13a of the external electrode 12a, and the solder fillet 32b enters into the groove 13b of the external electrode 12b, whereby strength in boding to the printed circuit board 30 can be secured, and peeling of the multilayer ceramic capacitor 10 from the printed circuit board 30 can be prevented.

Figure 9B:
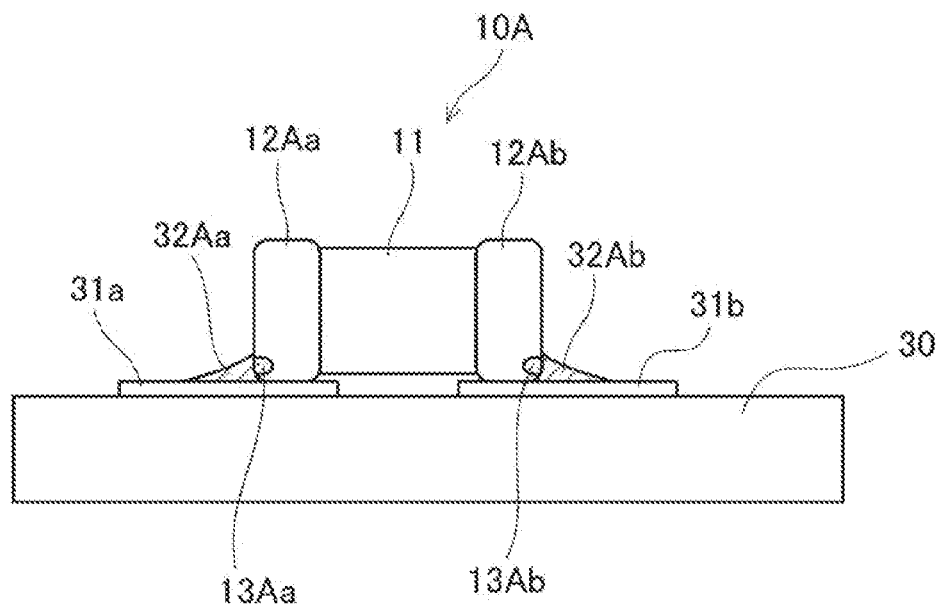
FIG. 9B is a figure depicting a mounting example of the multilayer ceramic capacitor according to the embodiment.

FIG. 9B is a figure depicting a mounting example of the multilayer ceramic capacitor 10A according to the present embodiment.

In FIG. 9B, there are depicted land patterns 31a and 31b provided spaced from each other on a printed circuit board 30, the multilayer ceramic capacitor 10A having the external electrodes 12Aa and 12Ab provided respectively at both end portions of the element body 11, a solder fillet 32Aa provided in contact with the external electrode 12Aa and the land pattern 31a, and a solder fillet 32Ab provided in contact with the external electrode 12Ab and the land pattern 31b.

In FIG. 9B, the amounts of the solder are smaller than those in FIG. 9A. Since the grooves 13Aa and 13Ab are provided on the mounting surface side in the external electrodes 12Aa and 12Ab of the multilayer ceramic capacitor 10A, however, the solder fillet 32Aa enters into the groove of the external electrode 12Aa, and the solder fillet 32Ab enters into the groove of the external electrode 12Ab, whereby it is ensured that strength in boding to the printed circuit board as a mounting substrate can be secured notwithstanding the small solder amounts, and peeling of the multilayer ceramic capacitor 10A from the printed circuit board 30 can be prevented.

Figure 9C:
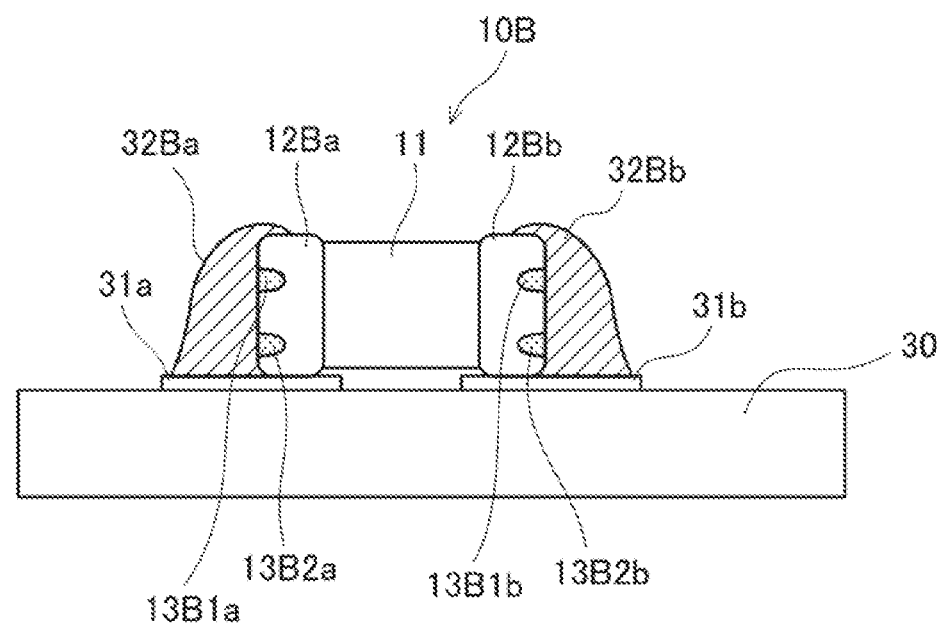
FIG. 9C is a figure depicting a mounting example of the multilayer ceramic capacitor according to the embodiment.

FIG. 9C is a figure depicting a mounting example of the multilayer ceramic capacitor 10B according to the present embodiment.

In FIG. 9C, there are depicted land patterns 31a and 31b provided spaced from each other on a printed circuit board 30, the multilayer ceramic capacitor 10B having the external electrodes 12Ba and 12Bb respectively at both end portions of the element body 11, a solder fillet 32Ba provided in contact with the external electrode 12Ba and the land pattern 31a, and a solder fillet 32Bb provided in contact with the external electrode 12Bb and the land pattern 31b.

In FIG. 9C, the external electrodes 12Ba and 12Bb of the multilayer ceramic capacitor 10B are provided with grooves 13B2a and 13B2b on the mounting surface side, and are provided with grooves 13B1a and 13B1b in the center in the height direction. Therefore, the solder fillet 32Ba enters into one or both of the two grooves of the external electrode 12Ba, and the solder fillet 32Bb enters into one or both of the two grooves of the external electrode 12Bb, whereby it is ensured that strength in boding to the printed circuit board 30 can be secured even in the case of small solder amounts, and, depending on the amounts of the solder, the strength in boding to the printed circuit board 30 can be enhanced.

In this way, the multilayer ceramic capacitor according to the present embodiment can be mounted onto the printed circuit board as a mounting substrate by the solder for a reflow treatment.

At the time of thus performing the reflow treatment, the multilayer ceramic capacitor is heated up to 250° C., for example.

By this, hydrogen contained in the multilayer ceramic capacitor, specifically in the metal plating film inside the external electrodes, is released through the grooves of the external electrodes.

As has been described above, the external electrodes are provided with the grooves, whereby hydrogen present inside the multilayer ceramic capacitor is removed, and, by filling up the grooves after hydrogen removal, penetration of moisture or the like after mounting can be prevented. In addition, by an anchoring effect, it is possible to secure strength in boding of the multilayer ceramic capacitor to the printed circuit board as a mounting substrate, and further to enhance the strength in boding the multilayer ceramic capacitor to the printed circuit board as the mounting substrate.

In addition, at the time of thus mounting the multilayer ceramic capacitor to the printed circuit board as a mounting substrate, the mounting is preferably performed in such a manner that the grooves formed in the external electrodes are provided below the center in the height direction of each of the external electrodes, with the mounting surface to which the multilayer ceramic capacitor is mounted as a reference.

Meanwhile, the multilayer ceramic capacitor 10 is generally carried in the state of being accommodated in a package at the time of mounting.

Figure 10:
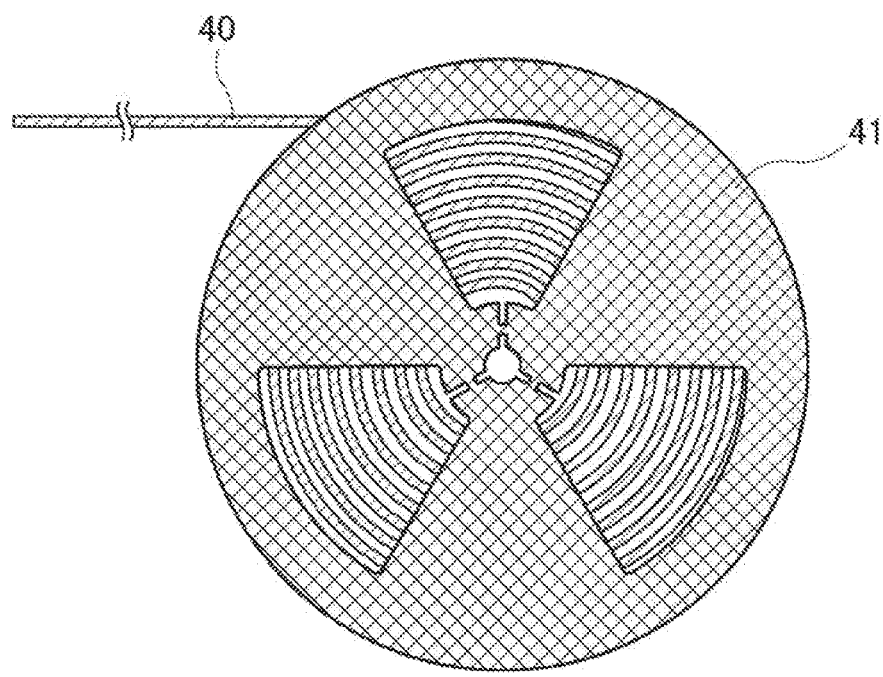
FIG. 10 is an external appearance view depicting a state in which a package accommodating therein the multilayer ceramic capacitors according to the embodiment is wound around a take-up reel.

FIG. 10 an external appearance view depicting a state in which a package 40 accommodating therein the multilayer ceramic capacitors 10 according to the present embodiment is wound around on a take-up reel 41.

As illustrated in FIG. 10, the package 40 is stored or carried in the state of being wound around the take-up reel 41, and is set on a mounting apparatus such as a mounter.

Figure 11:
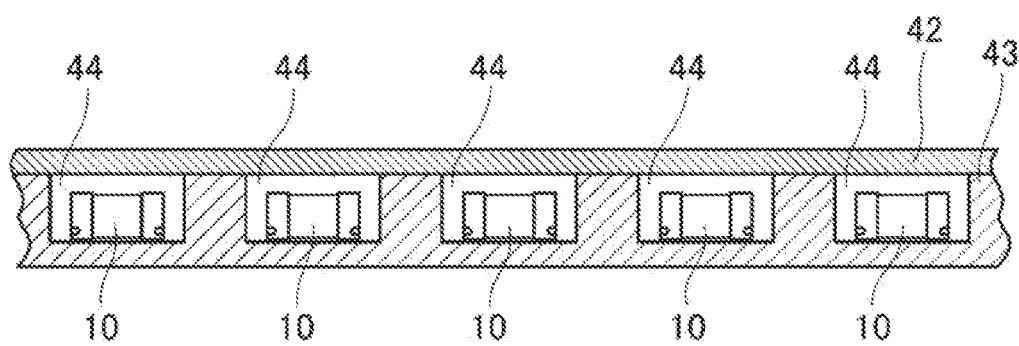
FIG. 11 is an enlarged sectional view of the package illustrated in FIG. 10.

FIG. 11 is an enlarged sectional view of the package 40 depicted in FIG. 10.

The package 40 depicted in FIG. 11 includes a cover tape 42 and a carrier tape 43.

The carrier tape 43 is provided, in the longitudinal direction thereof, with a plurality of recesses 44 each capable of accommodating the multilayer ceramic capacitor 10 therein.

Each of the plurality of recesses 44 is a recessed hollow formed in a bonding surface for bonding to the cover tape 42.

The cover tape 42 is for covering at least the recesses 44, by being adhered to the carrier tape 43.

At the time of mounting the multilayer ceramic capacitor 10, the cover tape 42 is peeled off from the carrier tape 43, and the multilayer ceramic capacitor 10 is taken out of the recess 44 of the carrier tape 43.

Examples of the material for the cover tape 42 include resins.

In addition, examples of the material for the carrier tape 43 include papers and resins.

Here, examples of the resins include polystyrene, polyethylene terephthalate, polypropylene, and polycarbonate.

Note that taking-out of the multilayer ceramic capacitor 10 from the recess 44 of the carrier tape 43 may be carried out by a general pick-up method, and is not limited to a specific method.

Examples of such a pick-up method include a method of picking up by suction attracting the multilayer ceramic capacitor 10 by a pick-up apparatus provided with a suction collet.

Note that it is preferable that the grooves of the multilayer ceramic capacitor 10 are located on the side of the bottom of the recess 44.

The side of the bottom of the recess 44 is the side of the printed circuit board at the time of mounting. Therefore, where the plurality of multilayer ceramic capacitors 10 accommodated in the plurality of recesses 44 of the carrier tape 43 are accommodated in such a manner that the grooves are located nearer to the side of the bottoms of the recesses 44, the up-down direction of the multilayer ceramic capacitor 10 at the time of mounting can be controlled.

In other words, the multilayer ceramic capacitor 10 can be mounted in such a direction that the grooves are located nearer to the side of the mounting surface of the printed circuit board.

In addition, for example, when the external electrodes of the multilayer ceramic capacitor 10 are viewed from an oblique upper side, reflectance differs depending on the position of the grooves of the external electrodes. Therefore, where image processing is performed using an image picked up at the time of handling, the multilayer ceramic capacitor 10 can be thereby accommodated in such a manner that the grooves are located on the side of the bottom of the recess 44 of the carrier tape 43.

Note that while the positions of the grooves of all the multilayer ceramic capacitors 10 are located on the side of the bottoms of the recesses 44 of the carrier tape 43 in FIG. 11, all the multilayer ceramic capacitors 44 may not necessarily be set in such a direction.

For example, where 70 or more multilayer ceramic capacitors 10 out of 100 multilayer ceramic capacitors 10 sampled arbitrarily are accommodated in such a direction, the above-mentioned effect can be obtained.

Besides, in the case where only part of the multilayer ceramic capacitors are provided with the grooves, if 70% or more of the products provided with the grooves are accommodated in such a direction, the above-mentioned effect can be obtained.

Figure 12:
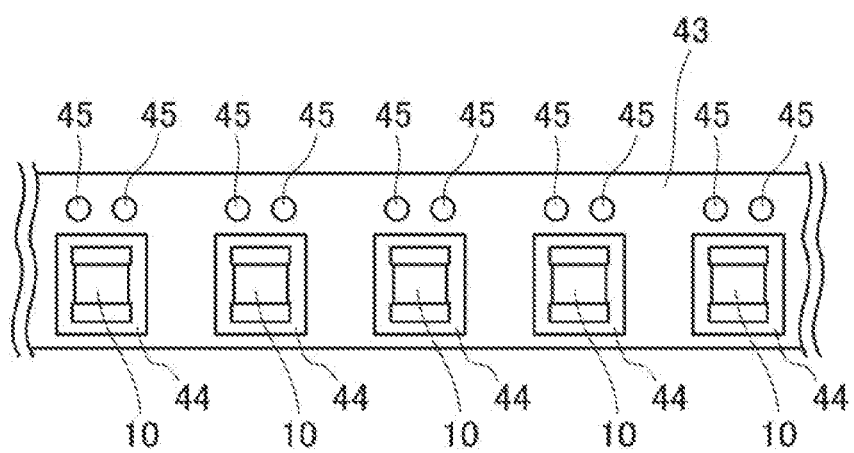
FIG. 12 is a plan view of a carrier tape depicted in FIG. 11.

FIG. 12 is a plan view of the carrier tape 43 depicted in FIG. 11.

As illustrated in FIG. 12, the carrier tape 43 is provided in the longitudinal direction thereof with a plurality of feed holes 45. With the carrier tape 43 fed by using the plurality of feed holes 45 at the time of mounting, peeling of the cover tape 42 can be performed easily.

The package in which the cover tape and the carrier tape provided with the recesses for accommodating the aforementioned multilayer ceramic capacitors are thus adhered to each other is also included in the present disclosure.

As has been described above, according to the present embodiment, it is possible to reduce the amount of hydrogen inside the multilayer ceramic capacitor and to prevent penetration of moisture or the like after mounting.

In addition, the opening portions for removal of hydrogen are not formed throughout a whole surface or at random but are formed in a linear form at only a predetermined part; therefore, the grooves can be entirely filled up by soldering at the time of mounting, without complicating the steps.

Accordingly, the reliability of the multilayer ceramic capacitor mounted can be enhanced without complicating the steps.

The present disclosure may be practiced or embodied in still other ways without departing from the spirit or essential character thereof. The preferred embodiment described herein is therefore illustrative and not restrictive, the scope of the disclosure being indicated by the appended claims and all variations which come within the meaning of the claims are intended to be embraced therein. The present disclosure contains subject matter related to that disclosed in Japanese Priority Patent Application JP 2018-076505 filed in the Japan Patent Office on Apr. 12, 2018, the entire content of which is hereby incorporated by reference.

What is claimed is:

1. A multilayer ceramic capacitor, comprising: an element body in which a dielectric layer and an internal electrode layer are laminated; a first external electrode that is provided at one end of the element body, wherein the first external electrode is connected to a first part of the internal electrode layer; and a second external electrode that is provided at another end of the element body, wherein the second external electrode is connected to a second part of the internal electrode layer, the first part of the internal electrode layer is different from the second part of the internal electrode layer, each of the first external electrode and the second external electrode comprises four external electrode layers, each of the first external electrode and the second external electrode has a first area and a second area, an outermost external electrode layer, of the four external electrode layers, of each of the first external electrode and the second external electrode has the first area, an innermost external electrode layer, of the four external electrode layers, of each of the first external electrode and the second external electrode has the second area, each of the first external electrode and the second external electrode has a linear groove only in the corresponding first area, of the outermost external electrode layer, opposite to the corresponding second area, of the innermost external electrode layer, in contact with the element body, and the first area of the outermost external electrode layer of each of the first external electrode and the second external electrode is a region where the first external electrode, the second external electrode, and the element body are overlapped from a perspective view of the multilayer ceramic capacitor; wherein a depth of the linear groove is in a range of 1 um to 10 um.

2. The multilayer ceramic capacitor according to claim 1, wherein the four external electrode layers of each of the first external electrode and the second external electrode are laminated metallic layers.

3. The multilayer ceramic capacitor according to claim 1, wherein the outermost external electrode layer of each of the first external electrode and the second external electrode is a metallic layer containing tin as a main constituent.

4. The multilayer ceramic capacitor according to claim 1, wherein each of the first external electrode and the second external electrode includes one of a nickel plating film or a copper plating film.

5. A printed circuit board, comprising: a land pattern to which a first external electrode and a second external electrode of a multilayer ceramic capacitor are joined by a solder, wherein the multilayer ceramic capacitor includes: an element body in which a dielectric layer and an internal electrode layer are laminated, the first external electrode that is provided at one end of the element body, wherein the first external electrode is connected to a first part of the internal electrode layer, and the second external electrode that is provided at another end of the element body, wherein the second external electrode is connected to a second part of the internal electrode layer, the first part of the internal electrode layer is different from the second part of the internal electrode layer, each of the first external electrode and the second external electrode comprises four external electrode layers, each of the first external electrode and the second external electrode has a first area and a second area, an outermost external electrode layer, of the four external electrode layers, of each of the first external electrode and the second external electrode has the first area, an innermost external electrode layer, of the four external electrode layers, of each of the first external electrode and the second external electrode has the second area, each of the first external electrode and the second external electrode has a linear groove only in the corresponding first area, of the outermost external electrode layer, opposite to the corresponding second area, of the innermost external electrode layer, in contact with the element body, the first area of the outermost external electrode layer of each of the first external electrode and the second external electrode is a region where the first external electrode, the second external electrode, and the element body are overlapped from a perspective view of the multilayer ceramic capacitor, and the linear groove of each of the first external electrode and the second external electrode is filled with the solder; wherein a depth of the linear groove is in a range of 1 um to 10 um.

6. The printed circuit board according to claim 5, wherein the linear groove is provided below a center in a height direction of each of the first external electrode and the second external electrode, with a mounting surface to which the multilayer ceramic capacitor is mounted as a reference.

7. A multilayer ceramic capacitor, comprising: an element body in which a dielectric layer and an internal electrode layer are laminated; a first external electrode that is provided at one end of the element body, wherein the first external electrode is connected to a first part of the internal electrode layer, the first external electrode comprises a nickel paste layer, a copper plating layer, and a nickel plating layer, and the copper plating layer is between the nickel paste layer and the nickel plating layer; and a second external electrode that is provided at another end of the element body, wherein the second external electrode is connected to a second part of the internal electrode layer, the first part of the internal electrode layer is different from the second part of the internal electrode layer, each of the first external electrode and the second external electrode comprises four external electrode layers, and an outermost external electrode layer, of the four external electrode layers, of each of the first external electrode and the second external electrode has a linear groove; wherein a depth of the linear groove is in a range of 1 um to 10 um.

8. The multilayer ceramic capacitor according to claim 7, wherein
the outermost external electrode layer of each of the first external electrode and the second external electrode has a first area,
an innermost external electrode layer, of the four external electrode layers, of each of the first external electrode and the second external electrode has a second area, and
the linear groove is only in the first area opposite to the second area in contact with the element body.

9. The multilayer ceramic capacitor according to claim 8, wherein the first area of the outermost external electrode layer of each of the first external electrode and the second external electrode is a region where the first external electrode, the second external electrode, and the element body are overlapped from a perspective view of the multilayer ceramic capacitor.

* * * * *